United States Patent [19]

Skulski

[11] 4,194,165
[45] Mar. 18, 1980

[54] MINIATURE GUITAR AMPLIFIER

[76] Inventor: Peter J. Skulski, P.O. Box 5583, Mission Hills, Calif. 91345

[21] Appl. No.: 919,909

[22] Filed: Jun. 28, 1978

[51] Int. Cl.² ............................................. H03F 3/183
[52] U.S. Cl. .................................... 252/255; 84/1.16; 179/1 F; 179/1 VL; 330/265; 330/282
[58] Field of Search ................. 84/1.14, 1.16; 330/255, 330/108, 265, 282; 179/1 F, 1 VL

[56] References Cited

U.S. PATENT DOCUMENTS

| | | | |
|---|---|---|---|
| 3,478,158 | 11/1969 | Trainor | 84/1.14 X |
| 3,578,913 | 5/1971 | Ufkes | 179/1 F |
| 3,866,063 | 2/1975 | Long | 330/255 X |
| 3,898,576 | 8/1975 | Fukaya | 330/255 X |

Primary Examiner—James B. Mullins
Attorney, Agent, or Firm—Freilich, Hornbaker, Wasserman, Rosen & Fernandez

[57] ABSTRACT

A miniature guitar amplifier, having at least one very small (1¾ inch) speaker driven by complementary transistors connected in an emitter-follower push-pull arrangement, is made to sound very much like a large guitar amplifier having one or more large (12 inch) speakers by providing negative feedback to an operational amplifier that drives the power transistors. The operational amplifier has a differential input stage to provide a noninverting input terminal for the signal from a guitar pickup and an inverting input terminal for the feedback signal.

3 Claims, 1 Drawing Figure

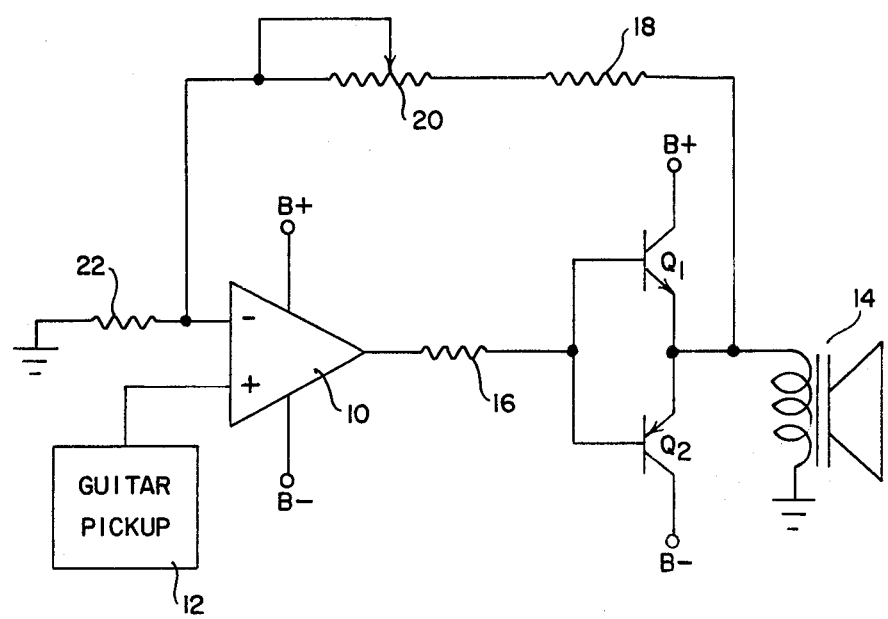

MINIATURE GUITAR AMPLIFIER

BACKGROUND OF THE INVENTION

This invention relates to a guitar amplifier, and more particularly to a miniature guitar amplifier.

Amplifiers for guitars are usually quite large in order to house large speakers, and amplifiers sufficient to drive the speakers. The power output of these amplifiers is quite large for use before a large audience. It is sometimes desirable to have a small or "miniature" guitar amplifier for use while playing for ones own entertainment in the privacy of the home or apartment, or for the purpose of tuning a guitar while backstage. Under those or other similar circumstances, a large amplifier is not required, and in fact cannot be satisfactorily used because operation of a large amplifier at very low volume unbalances the sound normally produced by a guitar amplifier. This is due primarily because the speakers and enclosure have been designed for efficient operation at moderate to high volume, and not at low volume. Thus, at low volume the high frequencies tend to fall off relative to the low frequencies. It has been discovered that a miniature guitar amplifier having very small speakers can be made to sound very much like a large guitar amplifier at low volume. What is needed to do that is a novel direct feedback arrangement for NPN and PNP power transistors connected for push-pull drive of one or more speakers.

SUMMARY OF THE INVENTION

In accordance with the present invention, a pair of complementary type (NPN and PNP) transistors, connected in am emitter-follower direct-coupled push-pull configuration to at least one speaker, are driven with base current through a common resistor by an operational amplifier having a differential input stage, with its noninverting input terminal connected to receive a signal from a guitar pickup, and a feedback circuit consisting of a first resistance element connected between the emitter outputs of the transistors and the inverting input terminal of the operational amplifier and a second resistance element connected between the inverting input terminal and circuit ground. The voltage dividing feedback provided by the first and second resistance elements is made adjustable for volume control.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Referring now to the sole FIGURE, a pair of complementary (NPN and PNP) power transistors $Q_1$ and $Q_2$ are connected in an emitter-follower push-pull configuration. The power transistors are coupled to an operational amplifier 10 that is connected to receive signals at its noninverting input terminal from a guitar pickup 12. The signals amplified by the operational amplifier drive a speaker 14 through a coupling resistor 16 connected to the base electrodes of the transistors. The collector electrodes of the transistors are connected to the positive and negative terminals of a suitable power supply, such as two 9 volt batteries.

The emitter electrodes of the transistors are connected to the inverting input terminal of the operational amplifier by a feedback circuit consisting of a first resistance element (resistors 18 and 20) and a second resistance element (resistor 22) to circuit ground. The resistor 20 is variable in order to adjust the feedback and thus the volume of the guitar amplifier.

The operational amplifier is preferably a type 741, but other operational amplifiers having a differential input stage could be used if provided with a gain comparable to that of a 741 operational amplifier. Such an arrangement provides an output from very small (1¾ inch) speakers with a tonal quality comparable to that from large (12 inch) speakers, i.e., with a natural distortion (fall off) of high frequencies at low volume. At high volume (but low power) the spectrum is substantially flat, i.e., of approximately equal amplitude at the low and the high ends. Only at low volume will the high frequencies fade. For such small speakers, the converse would be normally true: at low volume the low frequencies would fade relative to the high frequencies.

In use, the guitar player may adjust the amplifier at low or high volume, and achieve the tone of a large amplifier at both low and high volume.

In an exemplary embodiment, two 8-ohm speakers are connected in series, each speaker being only 1¾" in diameter, for a total load of 16 ohms using for $Q_1$ a 2N3904 and for $Q_2$ a 2N3906 transistor. The coupling resistor 16 is 100 ohms, and the feedback resistors 18 and 22 are 100 K ohms. The potentiometer is 5 megohms. A small (30 pf) capacitor may be connected in parallel with the potentiometer to trim the desired tone at low volume, but in practice that has been found to be unnecessary when using unshielded terminals on the potentiometer to connect to the circuit such that there is sufficient stray capacitance between the terminals.

The speakers are preferrably enclosed in a wood cabinet that is completely closed except of course in the front. However, it is not necessary that the enclosure be made of wood, not that it be completely enclosed. The guitar amplifier will produce a sound straight out of the speakers that is a sound very much like the sound produced by a large amplifier, so much so that the guitar player can use it at low or high volume, but always at low power output, to practice, tune his guitar, or simply for his own pleasure or the entertainment of others in a small room.

Although particular embodiments of the invention have been described and illustrated herein, it is recognized that modifications and variations may readily occur to those skilled in the art. It is therefore intended that the claims be interpreted to cover such modifications and variations.

What is claimed is:

1. A miniature guitar amplifier, for receiving a signal from a guitar pickup and at least one small speaker comprising
   a pair of complementary power transistors connected directly in a common-emitter push-pull configuration to said speaker,
   an operational amplifier having a differential input stage to provide a noninverting input terminal for receiving said guitar pickup signal, an inverting input terminal, and an output terminal,
   means for directly connecting the output of said operational amplifier to said power transistors to drive said speakers, and
   variable resistance means for directly connecting the emitter output of said power transistors to said inverting input terminal of said operational amplifier.

2. A guitar amplifier as defined in claim 1 wherein said variable resistance means is comprised of a voltage dividing circuit having a variable resistance element and a fixed resistance element connected in series between the emitter output of said power transistors and circuit ground, and the junction between said variable resistance element and said fixed resistance element is connected to said inverting input terminal of said operational amplifier.

3. A guitar amplifier as defined in claim 2 wherein said means for directly connecting the output of said operational amplifier to said power transistors is comprised of a resistor.

* * * * *